United States Patent [19]

Dutkewych et al.

[11] 4,144,119

[45] Mar. 13, 1979

[54] ETCHANT AND PROCESS

[76] Inventors: Oleh B. Dutkewych, 54 Highland Ave., Maplewood, N.J. 07040; Charles A. Gaputis, 423 Maple Blvd., Apt. 3W, Kansas City, Mo. 64124; Michael Gulla, 24 Ivy La., Sherborn, Mass. 01770; Leonard R. Levy, 6 Colonial Dr., Framingham, Mass. 01701

[21] Appl. No.: 822,003

[22] Filed: Sep. 30, 1977

[51] Int. Cl.$^2$ ............................................... C23F 1/02
[52] U.S. Cl. .................................... 156/659; 156/666; 156/901; 156/904; 252/79.2; 252/79.4
[58] Field of Search .................... 252/79.2, 147, 79.4; 427/96, 97; 29/625, 626; 174/68.5; 156/656, 659, 666, 901, 902, 630, 632, 634, 904; 428/137

[56] References Cited

U.S. PATENT DOCUMENTS

| | | | |
|---|---|---|---|
| 3,567,533 | 3/1971 | Chiang et al. | 252/79.2 X |
| 3,589,004 | 6/1971 | Shaheem | 156/629 X |
| 3,690,943 | 9/1972 | Papiano | 427/97 |

FOREIGN PATENT DOCUMENTS 49-47225  5/1974  Japan ...................................... 252/79.2

*Primary Examiner*—William A. Powell
*Attorney, Agent, or Firm*—Dike, Bronstein, Roberts, Cushman & Pfund

[57] ABSTRACT

This invention is directed to an etchant and to a process for its use. The etchant comprises sulfuric acid activated with hydrogen peroxide or the synergistic combination of hydrogen peroxide and molybdenum. The etchant is characterized by a source of phosphate ions as an inhibitor against attack on tin, especially immersion tin, as well as several other metals such as nickel and alloys of nickel such as gold alloys. The etchant is especially useful for etching copper and its alloys in the presence of a tin etch resist, and therefore, provides a new procedure for the fabrication of printed circuit boards using immersion tin as an etch resist.

12 Claims, No Drawings

ETCHANT AND PROCESS

BACKGROUND OF THE INVENTION

1. Introduction

This invention relates to an etchant comprising sulfuric acid activated with hydrogen peroxide or a synergistic combination of hydrogen peroxide and hexavalent molybdenum, a process for using the same, especially in the manufacture of printed circuit boards and novel articles made therewith.

2. Description of the Prior Art

The activation of relatively dilute mineral acids with an oxygen release compound is known in the art and described, for example, in *Plating*, "Surface Treatment of Metals with Peroxygen Compounds", Vol. 42, pg 561 (1955). In the Plating publication, it is taught that mineral acids such as sulfuric acid, nitric acid, acetic acid and phosphoric acid may be activated with oxygen release compounds such as hydrogen peroxide or other peroxy, persulfate or perborate compounds. The oxygen release compound enhances the etch rate thereby permitting a decrease in the concentration of acid.

Activation of dilute sulfuric acid with hydrogen peroxide is most attractive due to low cost and ease of electrolytic copper recovery from the spent etchant prior to disposal. However, the utility of such hydrogen peroxide etching solutions is reduced somewhat due to catalyzed decomposition of hydrogen peroxide caused by etched metal ions or other transition metal ions in solution and a slow etch rate, typically 1.4 mils of copper from 1 ounce copper clad laminate in 10–25 minutes at 120° F. To enhance etch rate, more concentrated solutions of hydrogen peroxide have been used, but concentrated peroxide solutions are hazardous to health and safety. In addition, such etchants have not been successfully used with tin dissimilar metal etch resists because they attack tin, especially immersion tin.

To limit metal ion catalyzed decomposition of hydrogen peroxide, a number of stabilizers are used in the prior art. A variety of such stabilizers is disclosed in U.S. Pat. Nos. 3,293,093; 3,341,384; 3,407,141; and 3,668,131, all incorporated herein by reference. A preferred class of stabilizers is disclosed in U.S. Pat. No. 3,801,512 incorporated herein by reference. The stabilizers disclosed in said patent are the arylsulfonic acids.

Though stabilized acid solutions activated with hydrogen peroxide are improved over their unstabilized counterparts, nonetheless they still possess disadvantages which limit their use, particularly for the manufacture of printed circuit boards.

In commonly assigned copending U.S. patent application Ser. No. 822,002 (filed concurrently herewith), a new etchant is disclosed comprising hydrogen peroxide and a molybdenum compound in an acidic solution. The hydrogen peroxide provides sustained etching with the advantages and disadvantages described above. In the acid/peroxide environment, the molybdenum etches at a substantially greater rate and therefore exalts the rate to a desirable level for commercial use. The molybdenum cannot be used as a sole oxidant because it is rapidly depleted as it is reduced to a lower valent form as etching proceeds. It is therefore incapable of providing sustained etching. Though not wishing to be bound by theory, it is believed that the combination of the peroxide and the molybdenum is a synergistic combination because both are believed to etch though the peroxide in the acid environment is believed to provide the secondary function of oxidizing molybdenum to a higher valence capable of etching metals in the acidified peroxide environment.

The etchant of the above-noted copending application Ser. No. 822,002 is an improvement over the acid etchants activated with peroxide as disclosed in the prior art. However, the etchants of said application are not desirably used in certain specific processes for etching copper, including its alloys, where the copper is etched in the presence of tin as a metal etch resist such as in chemical milling of copper and in the manufacture of printed circuit boards. The limitation in the use of the etchant is a consequence of attack by the etchant on immersion tin and certain electroplated tins resulting in either the complete dissolution of the tin or partial removal of some of the tin and discoloration of the remaining tin.

SUMMARY OF THE INVENTION

In accordance with the subject invention, it has been found that the addition of phosphate ions to sulfuric acid etchants activated with hydrogen peroxide or a combination of hydrogen peroxide and molybdenum inhibits the attack of the etchant on the tin etch resists. Hence, the etchant of the invention may be used for etching copper in contact with a tin etch resist. Accordingly, processes for use of the etchant, in accordance with the invention, comprise providing a tin etch resist in a desired configuration over copper and contacting the same with the etchant of the invention for a period of time sufficient to remove unwanted copper. The tin etch resist can be either immersion tin or electroplated tin. The process is especially useful for the manufacture of printed circuit boards and in the chemical milling of copper.

In accordance with the above, there is provided by the subject invention:

a new etchant for etching copper in the presence of a tin etch resist;

new processes for chemical milling and for the manufacture of printed circuit boards characterized by etching copper in a desired configuration utilyzing tin as a metal etch resist; and new articles of manufacture comprising a copper substrate which has portions removed by etching and other portions not removed protected by a coating of a tin etch resist.

DESCRIPTION OF THE PREFERRED EMBODIMENTS

Sulfuric acid is used for purposes herein because it is the most economical, provides best results and yields copper sulfate upon saturation which is readily recovered by lowering the temperature of the etchant,. However, other acids may be used in admixture with the sulfuric acid for specific desired results. Therefore, the term sulfuric acid as used herein means sulfuric acid alone or in mixture with other acids in lesser amounts where desired.

The concentration of the acid may vary within broad limits but preferably, the acid content of the etchant is relatively low varying between 0.1 and 2.5 Normal and preferably between 0.5 and 1.5 Normal. It should be noted that lower concentrations are desirable for those etchants containing molybdenum.

The peroxide content of the etchant may vary within relatively broad limits such as from 0.1 to 10 moles per liter of solution. However, because peroxide is a relatively dangerous material to handle, its concentration is preferably maintained relatively low and preferably varies between about 0.5 and 2.5 moles per liter. As the peroxide content drops below about 0.3 moles per liter, the etch begins to attack tin notwithstanding the presence of the phosphate ions and will continue to do so until the peroxide is replenished.

A molybdenum compound is preferably added to the etchant as a synergistic co-oxidant with the hydrogen peroxide to exalt the etch rate. The particular molybdenum compound used does not appear to be critical provided it is sufficiently soluble in solution and is oxidized to a form that etches copper in the etchant environment. Preferably, the molybdenum is added as hexavalent molybdenum but may be added in a lower valence form as the peroxide will oxidize it to its higher valence forms. believed to be hexavalent molybdenum and/or permolybdate. The preferred molybdenum compound is sodium molybdate. Other useful molybdenum compounds include ammonium molybdate and molybdic acid.

The concentration of the molybdenum compound is not critical, it having been found that for immersion etching, the etch rate increases with small additions of molybdenum and levels off as concentration increases. For etching copper, some exaltation of the etch occurs when the molybdenum concentration is as low as 0.01 moles per liter (as molybdenum metal) and rapidly increases as the concentration increases to about 0.1 to 0.15 moles per liter. Thereafter, the etch rate continues to increase, but at a less rapid rate to a maximum rate obtained at between about 0.4 to 1.0 moles per liter dependent upon numerous variables such as temperature, peroxide content, dissolved metal content and the like. for spray etching an exalted rate occurs at higher concentrations of molybdenum than for immersion etching.

Based upon the above, it should be apparent that the molybdenum content may vary within broad limits priovded its concentration is sufficient to exalt the rate to that desired. Preferably, the concentration varies between 0.01 and 1.0 moles per liter and more preferably between 0.02 and 0.5 moles per liter.

With regard to the above concentrations for both the peroxide and the molybdenum when the latter is used, it has been found that to obtain satisfactory etching, the molar ratio of the peroxide to the molybdenum should be at least 1:1 and more preferably, at least 1.2:1. The upper limit to this ratio is of lesser importance.

It is of interest to note that in an etchant stabilized with an arylsulfonic acid, as the concentration of molybdenum increases up to about 0.75 moles per liter, the normal peroxide consumption is reduced. This is suggestive that the molybdenum is the primary etchant and the peroxide consumption is not due to etching, but rather to oxidation of the reduced form of molybdenum. In accordance with this invention, a compound that yields phosphate ions is added to the etchant to inhibit attack on tin etch resists. The preferred compound is phosphoric acid or an alkali phosphate. Typical examples of phosphate in addition to phosphoric acid include sodium phosphates and potassium phosphates. The concentration of the phosphate in the etchant is not cirtical, minor amounts inhibiting attack on tin to some degree and larger amounts providing greater protection up to a maximum where attack again appears. In general, the amount used is that amount that substantially eliminates the attack and this is dependent upon the composition of the etchant and the conditions under which it is used. Preferably, the concentration of the phosphate varies between 0.1 and 2.5 moles per liter (as phosphate) and more preferably, between 0.25 and 1.5 moles per liter.

In accordance with the most preferred embodiment of the invention, the etchant is stabilized to prevent catalytic decomposition of the peroxide caused by metal impurities. Though most stabilizers known to the art may be used, the preferred stabilizers are arylsulfonic acids or salts thereof as disclosed in the above-noted U.S. Pat. No. 3,801,512. A preferred stabilizer is phenol sulfonic acid. Other stabilizers that may be used include sulfosalicylic acid and toluene sulfonic acid. The concentration of the sulfonic acid may vary from as low as 1 gram per liter of solution to the solubility limit of the stabilizer but preferably varies between 3 and 30 grams per liter of solution.

Using the etchant of this invention to etch copper, at 120° F., the bath will dissolve about 70 to 80 grams of copper per liter. Maintaining the hydrogen peroxide concentration within 50–100% of its initial bath makeup and at all times in an amount sufficient to maintain a ratio of the peroxide to molybdenum of at least 1:1 when molybdenum is used permits continued operation until saturation with dissolved copper. Allowing the bath to cool to room temperature induces crystallization of copper compounds which may be recovered by filtration dependent upon the acid used. Readjustment in the concentration of the components of the etch solution makes the same suitable for reuse.

It is of interest to note that as etching proceeds, where molybdenum is present in the etchant, at the interface of the etchant and copper, a deep blue layer forms which is the color of molybdenum in a lower valence form. This is suggestive that molybdenum has been reduced by oxidation of the copper layer and dissolution of the same. This deep blue color will persist at the interface unless the etchant is stirred. If stirred, the color is lost which is further suggestive that the reduced molybdenum has been reoxidized to hexavalent form by the peroxide. Moreover, if the peroxide is not present in solution, etching will proceed but only for a short period of time and thereafter, etching stops. While etching is taking place, the entire solution becomes deep blue establishing that molybdenum does etch copper but is not reoxidized in the absence of the peroxide.

The etchants of this invention are used for the same purposes as similar etchants of the prior art. They are particularly useful for the manufacture of printed circuit boards and for chemical milling. Procedures for the formation of printed circuit boards are described in numerous publications, for example, in Coombs, PRINTED CIRCUITS HANDBOOK, McGraw-Hill Publishing Company, New York, 1967, Chapter 5, incorporated herein by reference.

In a typical process for the manufacture of printed circuit boards, a suitable base material is selected such as copper clad epoxy. Holes are drilled at appropriate locations on the board and the walls of the holes are metallized such as with copper to provide electrical contact between the two surfaces of the base material. Methods for metallization are known and include the steps of cleaning, catalyzing and electroless copper deposition.

Following metallization of the holes, utilizing a process known as pattern plating, a conductor pattern is formed on the copper by application of an organic resist material which may be either a photoresist or a screen resist dependent upon design and definition. The resist coats the copper that is not part of the conductor pattern and leaves the copper bare in a conductor pattern. The thickness of the conductor pattern is then increased using electroless and/or electrolytic copper plating procedures. Following the steps of copper plating, a dissimilar metal etch resist such as solder is applied over the copper in the conductor pattern to protect the same from subsequently applied etchants, the organic resist is removed exposing the unwanted copper (not part of the conductor pattern), and the unwanted copper is dissolved with a suitable etchant for the copper such as that disclosed herein while the conductor pattern is protected from the etchant by the dissimilar metal etch resist. Typically, the dissimilar metal etch resist is selected not only for its ability to withstand the etchant, but also for its solderability so the electrical connections can be soldered directly to the etch resist.

A novel process using the etchants of this invention comprises plating tin over copper as a metal etch resist rather than another metal etch resist heretofore used in the art such as solder. The tin is plated over those portions of the copper to be protected from the etchant and not over those portions to be removed. For example, in a process for the fabrication of a printed circuit board such as described above, an organic resist would be coated over the copper to define a copper conductor pattern in a manner known to the art. The copper in the conductor pattern would be plated with tin, the organic resist removed and the unwanted copper not protected by the tin etched with the etchant of this invention. Thereafter, the tin could, if desired, be reflowed by heating to a temperature above its melting point. Other components of an electrical assembly may then be joined directly to the tin in a manner similar to soldering.

An article manufactured by a process using tin such as described above is novel because it is believed that tin has not earlier been successfully used as an etch resist. Therefore, copper in a defined pattern, such as an image pattern, coated with tin is believed to comprise a new article of manufacture. Also considered to be a new article of manufacture is copper coated with tin in a defined pattern, as described above, having electrical or other connections directly to the tin.

A preferred tin for a process as described above is immersion tin where tin is deposited by displacement of copper of the copper substrate without the use of an external source of electricity. Immersion tin compositions are disclosed, for example, in U.S. Pat. No. 3,303,029 incorporated herein by reference. A preferred immersion tin composition comprises Example 1 of said patent.

Electrolytic tin can be used in the process, but is less desired because results therewith may be unpredictable due to the variety of additives typically added to such electroplating baths.

The invention will be better understood by reference to the following examples:

EXAMPLES 1-6

| Constituent | 1 | 2 | 3 | 4 | 5 | 6 |
|---|---|---|---|---|---|---|
| Sulfuric acid (50%) ml[1] | 200 | 200 | 200 | 200 | 200 | 200 |
| Hydrogen Peroxide (35%) ml | 100 | 100 | 100 | 100 | 100 | 100 |
| Sodium Molybdate gm | 10 | 10 | 10 | 10 | 10 | 10 |
| Phenolsulfonic acid gm | 16 | 16 | 16 | 16 | 16 | 16 |

-continued

| Constituent | 1 | 2 | 3 | 4 | 5 | 6 |
|---|---|---|---|---|---|---|
| Phosphoric acid (85%) ml | 0 | 10 | 10 | 50 | 100 | 250 |
| Water | | | to 1 liter | | | |
| Time[2] to etch 1 gm copper at 120° F (min) | 6 | 6 | 6 | 6 | 6 | 6 |

[1]Battery grade or better.
[2]By immersion of substrate in etchant.

The above illustrates that the concentration of the phosphoric acid has little effect on etch rate.

EXAMPLES 7-12

Using the formulations of Examples 1 through 6, copper panels measuring 3 inches by 3 inches and having a copper thickness of 1.4 mils had one-half of their surface coated with an immersion tin deposit. The immersion tin used was a formulation identified as LT-27 of Shipley Company Inc. The immersion tin was coated onto the copper by immersing the cleaned surface in the LT-27 formulation for 5 minutes at 170° F. The results obtained are as set forth in the following table:

| Example No. | Phosphoric acid Content in Etch (ml) | Attack on Tin |
|---|---|---|
| 7 | 0 | Tin fully dissolved |
| 8 | 10 | Tin fully dissolved |
| 9 | 25 | Tin fully dissolved |
| 10 | 50 | No attack |
| 11 | 100 | No attack |
| 12 | 250 | Some attack on edges |

From the above, it can be seen that for the formulations used, the formulations free of phosphate and containing phosphate only in minor amount attacked the tin and removed the same. As the phosphate concentration increased, no attack was observable until a high concentration was reached at which point, the etch again attacked the tin.

EXAMPLES 13-14

The procedures of Examples 1-12 were repeated using an etchant free of molybdenum. The formulation of the etchant and the results obtained are set forth below.

| Constituent | Amount | |
|---|---|---|
| | 13 | 14 |
| Sulfuric Acid (50%) ml[1] | 200 | 200 |
| Hydrogen Peroxide (35%) ml | 100 | 100 |
| Phenolsulfuric acid gm | 16 | 16 |
| Phosphoric acid (85%) ml | 50 | 250 |
| Water | to 1 liter | |
| Time[2] to etch copper at 120° F (min) | 18 | 19 |
| Attack on immersion tin LT-27 | none | Partial on edges |

[1]Battery grade or better.
[2]By immersion in etchant of 1.4 mil copper clad epoxy substrate measuring 3"×3" having ½ its surface coated with LT-27 tin.

From the above, it is apparent that molybdenum is not a factor is preventing attack on tin.

EXAMPLES 15-20

Other sources of phosphate were substituted for phosphoric acid in Example 1 with the resulting formulations used to etch a 3"×3" copper clad epoxy panel having ½ of its surface area coated with LT-27 tin. The phosphates used, the amounts and the results are set forth below:

| Example No. | Phosphate | Amount | Attack on Tin |
| --- | --- | --- | --- |
| 15 | Ammonium phosphate | 25 | Partial |
| 16 | Ammonium phosphate | 50 | None |
| 17 | Ammonium phosphate | 10 | None |
| 18 | Sodium phosphate | 30 | Partial |
| 19 | Sodium phosphate | 60 | None |
| 20 | Sodium phosphate | 120 | None |

The above shows that the source of the phosphate is immaterial though it is desirable that the cation not be a source of contamination and therefore, the preferred cation is hydrogen or an alkali metal.

The etchants of this invention are used for the manufacture of printed circuit boards using various resists such as conventional acid resistant organic resists, screen resists, UV curable screen resists and most inorganic similar metal electroplate resists including, in addition to immersion tin and electrolytic tin, lead tin alloy, gold and nickel gold. A process for manufacturing a printed circuit board using an etchant of this invention is as follows:

EXAMPLE 21

A printed circuit board is prepared from a copper clad G-10 substrate using the following sequence of steps:

(a) Clean the substrate and drill holes at appropriate locations.

(b) Metallize the walls of the holes by electroless plating including the steps of catalysis with a catalyst such as Catalyst 6F of Shipley Company Inc., accelerate with a mild acid solution and electrolessly plate copper such as with copper mix CP-74 of Shipley Company Inc.

(c) Apply a positive working photoresist such as AZ-119, expose and develop.

(d) Electroplate copper to full desired thickness, (e) Apply immersion tin over the exposed copper.

(f) Remove the photoresist by dissolution in a suitable solvent.

(g) Remove exposed copper by immersion of the epoxy coated board in the etchant of Example 4 until all unwanted copper is dissolved.

We claim:

1. A sulfuric acid etchant activated with an oxidant combination of hydrogen peroxide and molybdenum, the hydrogen peroxide being present in an amount sufficient to oxidize the molybdenum and provide sustained etching and the molybdenum being present in an amount sufficient to exalt the etch rate to a rate in excess of that achievable by the peroxide alone, said etchant being characterized by the inclusion of phosphate ions in an amount sufficient to inhibit the attack of the etchant on tin.

2. The etchant of claim 1 where the concentration of the acid varies between 0.01 and 2.5 Normal, the concentration of the peroxide varies between 0.1 and 10 moles per liter, the concentration of the molybdenum varies between 0.01 and 1.0 moles per liter and the concentration of the phosphate varies between 0.1 and 2.5 moles per liter.

3. The etchant of claim 1 wherein the concentration of the acid varies between 0.5 and 1.5 Normal, the concentration of the peroxide varies between 0.5 and 2.5 moles per liter, the concentration of the molybdenum varies between 0.02 and 0.5 moles per liter, the concentration of the phosphate varies between about 0.25 and 2.5 moles per liter and the molar ratio of the peroxide to the molybdenum is at least 1.2 to 1.

4. The etchant of claim 1 where the source of phosphate is phosphoric acid.

5. A process for etching copper metals coated in part with tin comprising the step of contact of said copper with the etchant of claim 1.

6. The process of claim 5 wherein the tin defines a pattern on the surface of said copper.

7. The process of claim 6 where said tin is immersion tin.

8. The process of claim 6 where said tin is electroplated tin.

9. A process for making a printed circuit board by etching a conductor pattern on a copper surface comprising defining a conductor pattern by coating said copper with tin in said conductor pattern and etching copper not coated with tin with the etchant of claim 1.

10. The process of claim 9 where the tin is immersion tin.

11. The process of claim 9 where the tin is electroplated tin.

12. The process of claim 9 including the step of joining members of an electrical assembly to said tin.

* * * * *